United States Patent [19]
Takabe

[11] Patent Number: 6,008,663
[45] Date of Patent: Dec. 28, 1999

[54] ELIMINATING PHASE SHIFT IN AN INTEGRATED CIRCUIT TESTER

[75] Inventor: Kensuke Takabe, Tokyo, Japan

[73] Assignee: Ando Electric Co., Ltd., Tokyo, Japan

[21] Appl. No.: 09/030,273

[22] Filed: Feb. 25, 1998

[30] Foreign Application Priority Data

Feb. 27, 1997 [JP] Japan ...................................... 9-044330

[51] Int. Cl.$^6$ ............................. G01R 25/04; G01R 31/26
[52] U.S. Cl. ................... 324/765; 324/76.52; 324/76.74; 324/76.79
[58] Field of Search ..................................... 324/521, 537, 324/765, 76.52, 76.54, 76.62, 76.74, 76.77, 76.79

[56] References Cited

U.S. PATENT DOCUMENTS

| | | | |
|---|---|---|---|
| 5,006,794 | 4/1991 | Gal et al. | 324/537 |
| 5,231,598 | 7/1993 | Vlahos | 324/76.82 X |
| 5,646,519 | 7/1997 | Hamilton et al. | 324/76.79 |
| 5,894,226 | 4/1999 | Koyama | 324/765 |

*Primary Examiner*—Glenn W. Brown
*Attorney, Agent, or Firm*—Fish & Richardson P.C.

[57] ABSTRACT

An integrated circuit (IC) testing apparatus automatically detects and eliminates a phase difference between signals. A signal selection circuit 30 selects two test signals from a test pattern applied to a test device and outputs two test signals as a standard signal and comparison signal. A phase difference extraction circuit 40 extracts a phase difference between the standard signal and the comparison signal, while a mask circuit 50 generates a mask to eliminate unnecessary portions of the phase difference. A phase difference detection circuit 60 detects whether a phase difference exists and instructs whether to proceed with the counting of a counter circuit 90. A phase fail detection circuit 70 detects whether the phase of the comparison signal progresses ahead of the standard signal, and then outputs a fail signal. If a fail signal is not outputted, the counter circuit 90 determines the amount of delay of a programmable delay circuit 20 which then delays the comparison signal.

4 Claims, 4 Drawing Sheets

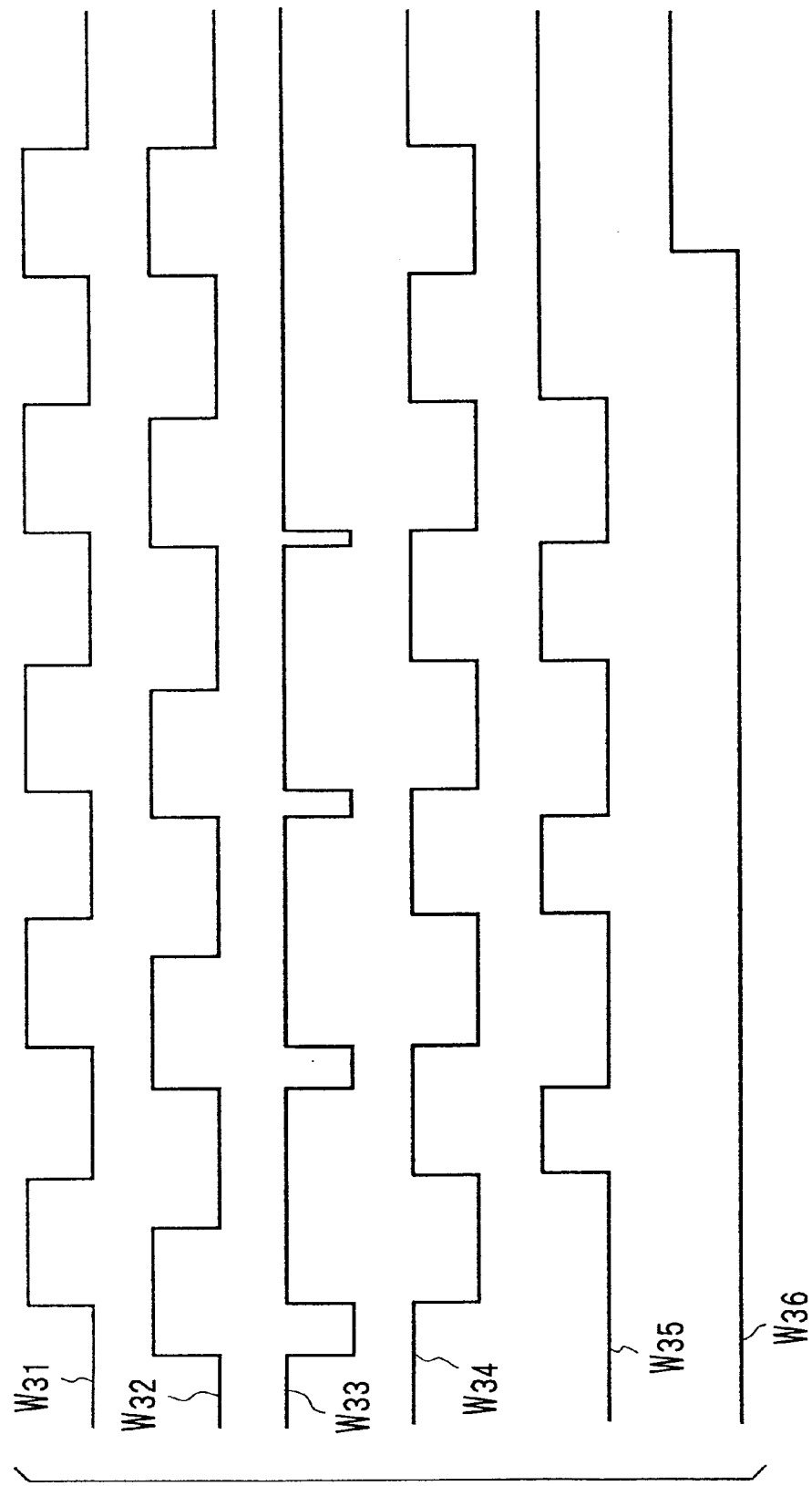

ELIMINATING PHASE SHIFT IN AN INTEGRATED CIRCUIT TESTER

BACKGROUND OF THE INVENTION

1. Technical Field of the Invention

The present invention relates to an IC (Integrated Circuit) testing apparatus. More particularly, it relates to an IC testing apparatus which eliminates the phase shift between the signals applied to a device to be tested.

2. Description of the Related Art

When IC's such as RAM's (Random Access Memory) are manufactured, it is necessary to test whether or not the manufactured IC's are working properly and possess the desired function. Generally, an IC testing apparatus is employed in the testing process.

A simple example of the operation of an IC testing apparatus will be explained for the case where the device to be tested (hereinafter, referred to as test device) is a RAM. First, an IC testing apparatus is connected to a RAM by means of a plurality of address lines, a plurality of data lines, and a clock signal line such as for Row Address Strobe (RAS) signals. When the connection is completed, data is written in a memory location designated by the address lines via the data lines. Afterwards, the written data is read. Then this read data is compared to the written data and is determined whether the two pieces of data are identical or not. The testing process is thus performed by repeating the process of comparing the read data with the written data for each designated memory location.

As mentioned above, because the IC testing apparatus and the test device are connected by means of a plurality of address lines and a plurality of data lines, a phase difference is generated between the signals transmitted through each of the lines. This phase difference is referred to as skew.

This skew generally represents the phase or temporal shift from the expected value of the amplitude generated between signals, when identical signals are transmitted through a plurality of transmission lines. In the case of IC testing apparatuses, the problem originates in the dispersion of the driving characteristics of the driver and such, which drives the signals to be applied to the test devices.

When the above described phase difference is generated, adjustments are made by varying the amount of delay by inserting a delay line in between the connection lines, or by substituting an oscilloscope or such for the delay line and varying the amount of delay using the oscilloscope or such.

Generally, however, the above described testing process is not performed by connecting one IC testing apparatus with one test device. Instead, one IC testing apparatus is connected to a plurality of test devices, so a large amount of test devices are being tested simultaneously. Therefore, there is a need for phase adjustments of the signals applied to the test devices for each individual test devices. In addition, since there is a large number of lines used in connecting to each individual test devices, there are problems in eliminating the phase differences among each of the signals, such as requiring of a great amount time and being extremely laborious.

SUMMARY OF THE INVENTION

The present invention, hence, takes the above mentioned circumstances into consideration, and proposes to offer an IC testing apparatus which automatically detects a phase difference when a phase difference is generated between signals, and automatically eliminates the phase difference.

In order to achieve the above mentioned objective, the present invention comprises a selecting means for selecting two signals, a standard signal and a comparison signal, from a plurality of test signals, an extracting means for extracting a phase difference between the standard signal and the comparison signal, a determining means for determining the amount of delay of the comparison signal based on the phase difference extracted by the extracting means, a delaying means for delaying the comparison signal based on the amount of delay determined by the determining means, a detecting means for detecting the phase difference, and for instructing the determining means to fix the amount of delay when the phase difference is eliminated, and a controlling means for instructing the selecting means to change the selected test signals when the detecting means detects the elimination of the phase difference between the standard signal and the comparison signal, and for matching the phases of each of the test signals.

Because the selecting means is set to select two signals, a standard signal and a comparison signal, from a plurality of test signals, and the extracting means is set to extract a phase difference between the standard signal and the comparison signal, the present invention has the effect of automatically detecting a phase difference between test signals being supplied to a test device.

In addition, because the present invention equips a determining means for determining the amount of delay of the comparison signal based on the phase difference extracted by the extracting means, a delaying means for delaying the comparison signal based on the amount of delay determined by the determining means, a detecting means for detecting the phase difference, and for instructing the determining means to fix the amount of delay when the phase difference is eliminated, and a controlling means for instructing the selecting means to change the selected test signals when the detecting means detects the elimination of the phase difference between the standard signal and the comparison signal, and for matching the phases of each of the test signals, the present invention has the effect of automatically matching the plurality of test signals being supplied to a test device.

Further, the present invention equips a fail detecting means for detecting the progress of the phase of the comparison signal with respect to the phase of the standard signal, and then for outputting a fail signal to the controlling means.

It is desirable for the extracting means to equip a phase extracting portion which extracts the phase difference based on a logical operation performed on the standard signal with the comparison signal, and a mask generating portion which generates a mask for eliminating the portions of the phase difference extracted by the phase extracting portion which are unnecessary, based on a logical operation performed on the standard signal with the comparison signal.

BRIEF DESCRIPTION OF THE DRAWINGS

FIG. 4 is a diagram which illustrates the signal waveforms of each of the portions of the IC testing apparatus according to a preferred embodiment of the present invention.

DETAILED DESCRIPTION OF A PREFERRED EMBODIMENT OF THE INVENTION

A preferred embodiment of the present invention will be explained below with reference to drawings.

Figure 1:
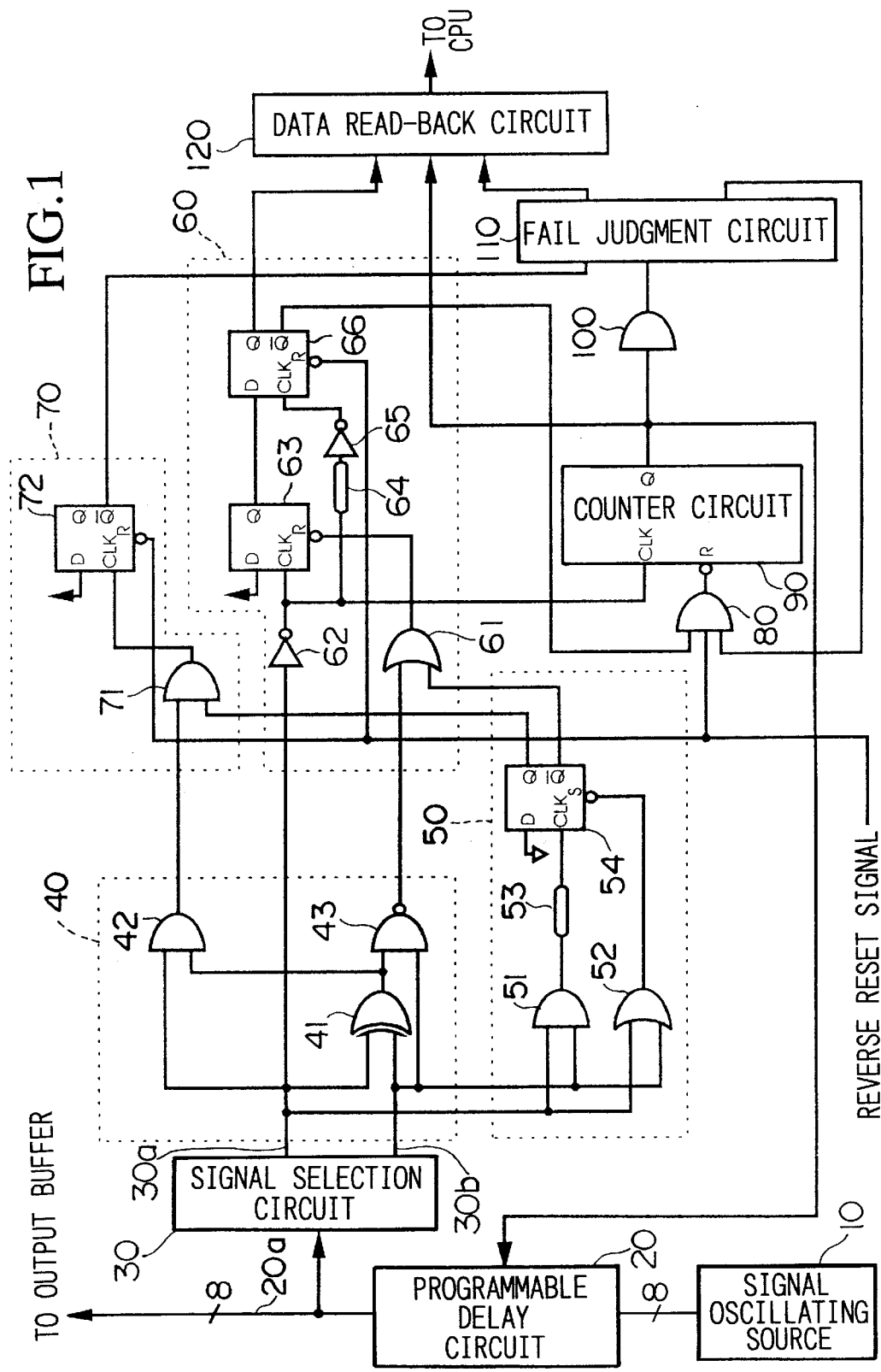
FIG. 1 is a block diagram which illustrates the structure of an IC testing apparatus according to a preferred embodiment of the present invention.

FIG. 1 is a block diagram which illustrates the structure of an IC (Integrated Circuit) testing apparatus according to a preferred embodiment of the present invention. Each of the portions of this IC testing apparatus is controlled by the CPU (Central Processing Unit; controlling means; not shown in diagram), and they function according to this control.

In FIG. 1, 10 is a signal oscillating source which generates a test pattern, for example an 8-bit parallel signal. 20 is a programmable delay circuit (delaying means), which is connected to the signal oscillating source 10, and applies a delay to each of the signal lines of the test pattern outputted from the signal oscillating source 10, based on the signal outputted from a counter circuit 90 (determining means), which will be described below. The output of this programmable delay circuit 20 is connected to the signal lines 20a, which have the same number of lines as the inputted signal lines, and is also connected to an output buffer (not shown in diagram). The test pattern (a plurality of test signals) supplied to this output buffer is supplied to a test device.

A signal selection circuit 30 (selecting means) is connected to the signal lines which are connected to each of the above mentioned signal lines 20a. This signal selection circuit selects two signal lines from the signal lines 20a based on the control of the above mentioned CPU, outputs to a signal line 30a the signal from one of the selected signals as a standard signal, and outputs to a signal line 30b the signal from the other selected signal as a comparison signal. These signal lines 30a, 30b are connected to a phase difference extraction circuit 40 (phase extracting portion) and a mask circuit 50 (mask generating portion).

This phase difference extraction circuit 40 detects and outputs the phase difference between the above described standard signal and comparison signal. As shown in the diagram, the phase difference extraction circuit 40 is formed by an EXOR (EXclusive OR) circuit 41, an AND circuit 42, and a NAND circuit 43. The signal line 30a is connected to one of the input ends of both the EXOR circuit 41 and the AND circuit 42. The signal line 30b is connected to the other input end of the EXOR circuit 41 and to one of the input ends of the NAND circuit 43. Also, the output end of the EXOR circuit 41 is connected to the other input ends of both the AND circuit 42 and the NAND circuit 43.

The above mentioned mask circuit 50 is a circuit which outputs mask signals for the detected signals outputted from the phase difference extracting circuit 40. In other words, the mask circuit 50 is a circuit which outputs signals to mask the unnecessary signals from among the above mentioned detected signals. As illustrated, the mask circuit 50 is formed by an AND circuit 51, an OR circuit 52, a delay circuit 53, and a D flip-flop (hereinafter, referred to as Dff) 54. The standard signal and the comparison signal which are inputted into the mask circuit 50 are each connected to the input ends of the AND circuit 51 and the OR circuit 52.

The delay circuit 53 is connected to the output end of the AND circuit 51, and the output end of this delay circuit 53 is connected to the clock end (CLK) of the Dff 54. Also, the output end of the OR circuit 52 is connected to the reverse set input end S of the Dff 54. The D input end of the Dff 54 is grounded. The signals outputted from the Q output end and the $\overline{Q}$ output end of this Dff 54 are the mask signals described above. Here, the signal "$\overline{Q}$" signifies the reverse output of the Q output.

60 is a phase difference detection circuit (detecting means), and it is a circuit which detects whether or not there exists a phase difference between the standard signal outputted from the signal selection circuit 30 and the comparison signal, based on the signals outputted from the phase difference extraction circuit 40 and the mask circuit 50. As shown in the diagram, the phase difference detection circuit 60 is formed by an OR circuit 61, a NOT circuit 62, a Dff 63, a delay circuit 64, a NOT circuit 65, and a Dff 66.

The output signal from the NAND circuit 43 of the phase difference extraction circuit 40 is connected to one of the input ends of the OR circuit 61, while the $\overline{Q}$ output of the Dff 54 of the mask circuit 50 is connected to the other input end. That is to say, the OR circuit 61 masks the unnecessary signals from among the signals outputted from the NAND circuit 43 using the signals outputted from the $\overline{Q}$ output of the Dff 54. The output of the OR circuit 61 is inputted into the reverse reset input end of the Dff 63. Also, the standard signal outputted from the signal selection circuit 30 is inputted into the NOT circuit 62, and the output end of this NOT circuit 62 is connected to the clock end (CLK) of the Dff 63. Moreover, the D input end of the Dff 63 is fixed at a voltage of highlevel (+5V).

Also, the output end of the above mentioned NOT circuit 62 is connected to the delay circuit 64, and the input end of the NOT circuit 65 is connected to this delay circuit 64. The output end of the NOT circuit 65 is connected to the clock end (CLK) of the Dff 66. In effect, the standard signal which is delayed by the delay circuit 64 is inputted into the clock end (CLK) of the Dff 66.

The D input end of the Dff 66 is connected to the Q output end of the Dff 63. Also, a reverse reset signal which is outputted from the above mentioned CPU is inputted into the reverse reset input end R of the Dff 66. This reverse reset signal is a signal which indicates whether or not to reset the operation of the IC testing apparatus illustrated in FIG. 1. When the reverse reset signal is at a voltage of highlevel, the usual operation is performed, but when the it is at a voltage of lowlevel, then the operation is reset.

The inside structure of the phase difference detection circuit 60 was described above. However, it should be noted that, in the case where there is a phase difference between the standard signal and the comparison signal, the Q output of the Dff 66 is at a voltage of lowlevel, while the voltage is at highlevel in the case where there is no phase difference.

70 is a phase fail detection circuit (fail detecting means), and it is a circuit which examines the type of phase difference between the standard signal and the comparison signal outputted from the phase selection circuit 30. In other words, it is a circuit which detects whether or not the standard signal lags behind the comparison signal, and if the phase of the standard signal lags behind that of the comparison signal, then a fail signal is outputted. As shown in the diagram, the phase fail detection circuit 70 is formed by an AND circuit 71 and a Dff 72. One of the input ends of the above mentioned AND circuit 71 is connected to the output end of the AND circuit 42 of the phase difference extraction circuit 40, while the other input end is connected to the Q output end of the Dff 54 of the mask circuit 50.

That is to say, the above mentioned AND circuit 71 masks the unnecessary signals from among the signals outputted from the AND circuit 42 using the signals outputted from the Q output end of the Dff 54.

The output end of the AND circuit 71 is connected to the clock end (CLK) of the Dff 72, and the D input end of the Dff 72 is fixed at a voltage of highlevel (+5V). Also, the reverse reset signal outputted from the above mentioned CPU is inputted into the reverse reset input end R of the Dff 72. A fail signal is outputted from the $\overline{Q}$ output end of the Dff 72.

In the diagram, the reverse reset signal supplied from the above mentioned CPU is supplied to 80, which is an AND circuit that is also connected to the $\overline{Q}$ output end of the Dff 66, as well as, to the output end of a fail judgment circuit 110 which will be explained below. The output end of this AND circuit 80 is inputted into the reverse reset input end of a counter circuit 90. Also, the clock end of this counter circuit 90 is connected to the output end of the NOT circuit 62. This counter circuit 90 is a circuit which sets the value which indicates the delay time of the comparison signal of the programmable delay circuit 20. That is to say, for example, if the standard signal were delayed with respect to the comparison signal, then the counter circuit 90 will gradually increase the amount of delay of the comparison signal at each input clock cycle.

The Q output end of the counter circuit 90 is formed by a plurality of bits, and the counted value is outputted. This Q output end is connected to the programmable delay circuit 20, and this programmable delay circuit 20 sets the amount of delay based on the value outputted from the Q output end. Also, an AND circuit 100 is connected to the output end of the counter circuit 90. When all of the bits of the Q output end of the counter circuit 90 is at a voltage of highlevel, the AND circuit 100 outputs a signal of a voltage of highlevel from its output end.

110 is a fail judgment circuit. The $\overline{Q}$ output end of the Dff 72 of the phase fail detection circuit 70 and the output end of the AND circuit 100 are inputted into the fail judgment circuit 110. The fail judgment circuit 110 has the function of resetting the counter circuit 90 when a phase fail is detected by the phase fail detection circuit 70 or when all of bits of the output of the counter circuit 90 are at a voltage of highlevel, and it also has the function of informing the CPU of those relative conditions.

120 is a data read-back circuit, and the Q output end of the Dff 66 of the phase difference detection circuit 60, and the Q output end of the counter circuit 90, and the output end of the fail judgment circuit 110 are connected to the input ends of this data read-back circuit 120. Each of the different types of information inputted at the input ends are latched and outputted to the CPU. In other words, the CPU may obtain information about the presence of a fail or a phase shift of a test pattern outputted from the signal oscillating source 10, based on the signal outputted from the data read-back circuit 120.

The above was an explanation of the structure of an IC testing apparatus according to a preferred embodiment of the present invention. The operation of an IC testing apparatus according to a preferred embodiment of the present invention will be explained below.

First, the operation up to the detection of a phase difference between the standard signal and the comparison signal outputted from the signal selection circuit 30 will be explained.

[The Case Where the Pulse Width of the Standard Signal is Wider than the Pulse Width of the Comparison Signal.]

Figure 2:
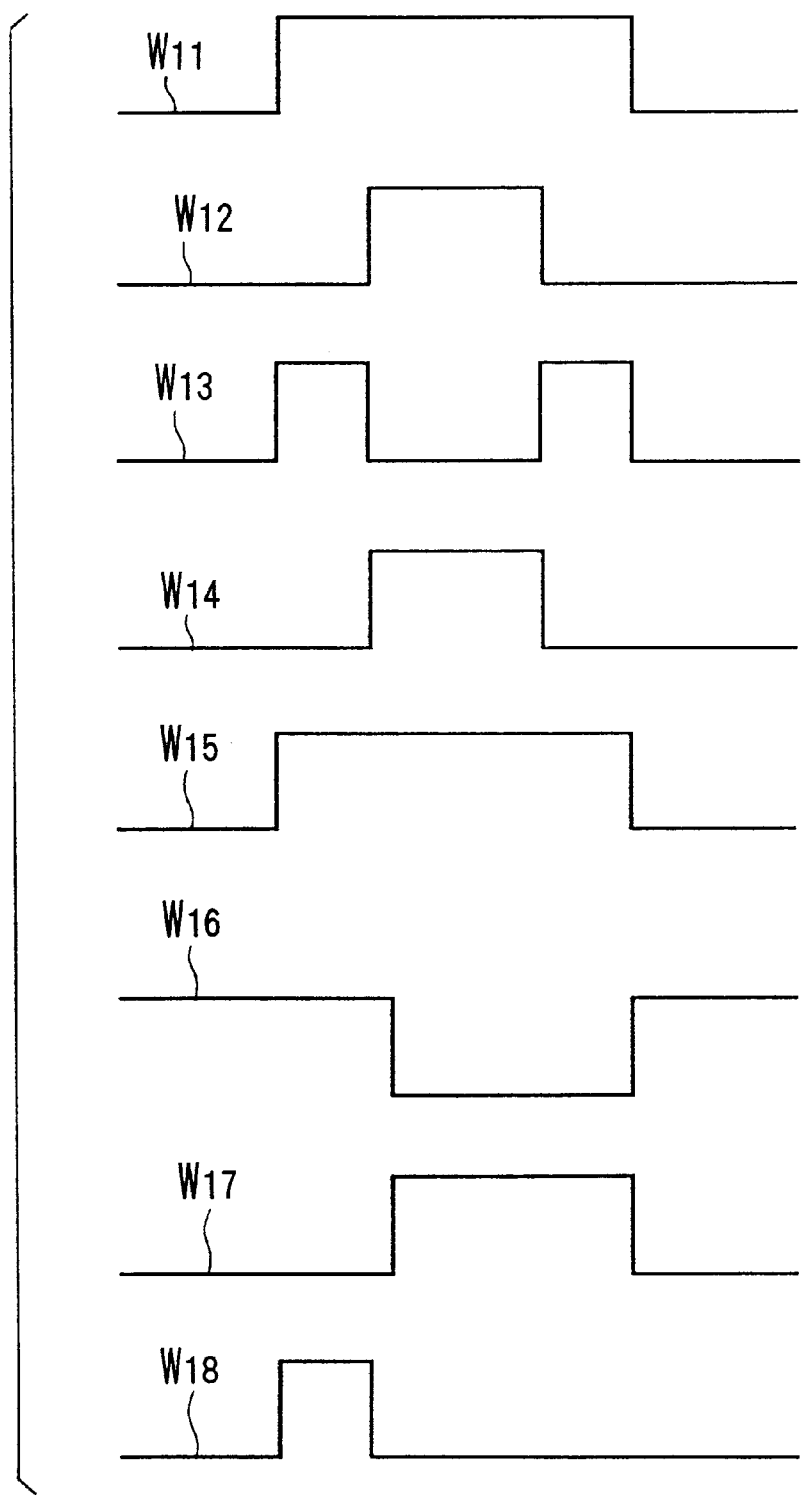
FIG. 2 is a diagram which illustrates the signal waveforms of each of the portions of the IC testing apparatus for the case where the pulse width of the standard signal is wider than the pulse width of the comparison signal.

FIG. 2 is a diagram which illustrates the signal waveforms of each of the portions of the IC testing apparatus for the case where the pulse width of the standard signal is wider than the pulse width of the comparison signal. Taking the case where the pulse width of the standard signal is wider than the pulse width of the comparison signal as an example, the operation up to the obtaining of the phase fail signal will be explained below, with reference to FIG. 1 and FIG. 2. It should be noted that the horizontal axis of FIG. 2 corresponds to the flow of time.

In FIG. 1, when a test pattern is outputted from the signal oscillating source 10, and it passes through the programmable delay circuit 20, the test pattern is then outputted to the output buffer and inputted into the signal selection circuit 30. Under the control of the CPU, the signal selection circuit 30 selects two signals from the signal lines 20a, and the standard signal and the comparison signal are outputted respectively to the signal line 30a and the signal line 30b.

The waveform of the outputted standard signal and the comparison signal have the reference numerals $W_{11}$, $W_{12}$, respectively, in FIG. 2. As can be seen from these two waveforms, the pulse width of the standard signal is wider than the pulse width of the comparison signal. These signals are inputted into the EXOR circuit 41 of the phase difference extraction circuit 40, and the exclusive-OR of the two signals is computed. The output of the EXOR circuit 41 is inputted into one of the input ends of both the AND circuit 42 and the NAND circuit 43. The standard signal is inputted into the other input end of the AND circuit 42, and an AND operation is performed on this standard signal with the output of the EXOR circuit 41. The output waveform of the AND circuit 42 has the reference numeral $W_{13}$ in FIG. 2.

Also, the above mentioned standard signal and the comparison signal are inputted into both the AND circuit 51 and the OR circuit 52 of the mask circuit 50, and the AND the OR of the two signals are computed, respectively. The output of the AND circuit 51 and the OR circuit 52 have the reference numerals $W_{14}$, $W_{15}$ in FIG. 2 and are illustrated, respectively. The output of the AND circuit 51 is inputted into the clock end (CLK) of the Dff 54 via the delay circuit 53, and the output of the OR circuit 52 is connected to the reverse set input end S of the Dff 54. In FIG. 2, if the signals with the reference numerals $W_{14}$, $W_{15}$ are outputted from the AND circuit 51 and OR circuit 52, then a signal with the reference numeral $W_{16}$ in FIG. 2 is outputted from the Q output end of the Dff 54. Also, a signal with the reference numeral $W_{17}$ is outputted from the $\overline{Q}$ output end of the Dff 54.

The output signal of the above mentioned AND circuit 42 and the output signal of the Q output end of the Dff 54 are inputted into the AND circuit 71 of the phase fail detection circuit 70, and an AND operation are performed on the two signals. That is to say, when the standard signal and the comparison signal are signals with the reference numerals $W_{11}$, $W_{12}$, respectively, in FIG. 2, two pulses are outputted from the AND circuit 42, as illustrated by the signal with the reference numeral $W_{13}$ in FIG. 2. However, only the left hand signal is necessary for performing a phase fail detection. Then, the right hand signal of the signal with the reference numeral $W_{13}$ in FIG. 2 is masked by the AND circuit 71, using the signal outputted from the Q output end of the Dff 54. The output of the AND circuit 71 is illustrated by the signal with the reference numeral $W_{18}$ in FIG. 2. This signal is used in detecting a phase fail within the phase fail detection circuit 70.

[The Case where the Pulse Width of the Comparison Signal is Wider than the Pulse Width of the Standard Signal.]

Figure 3:
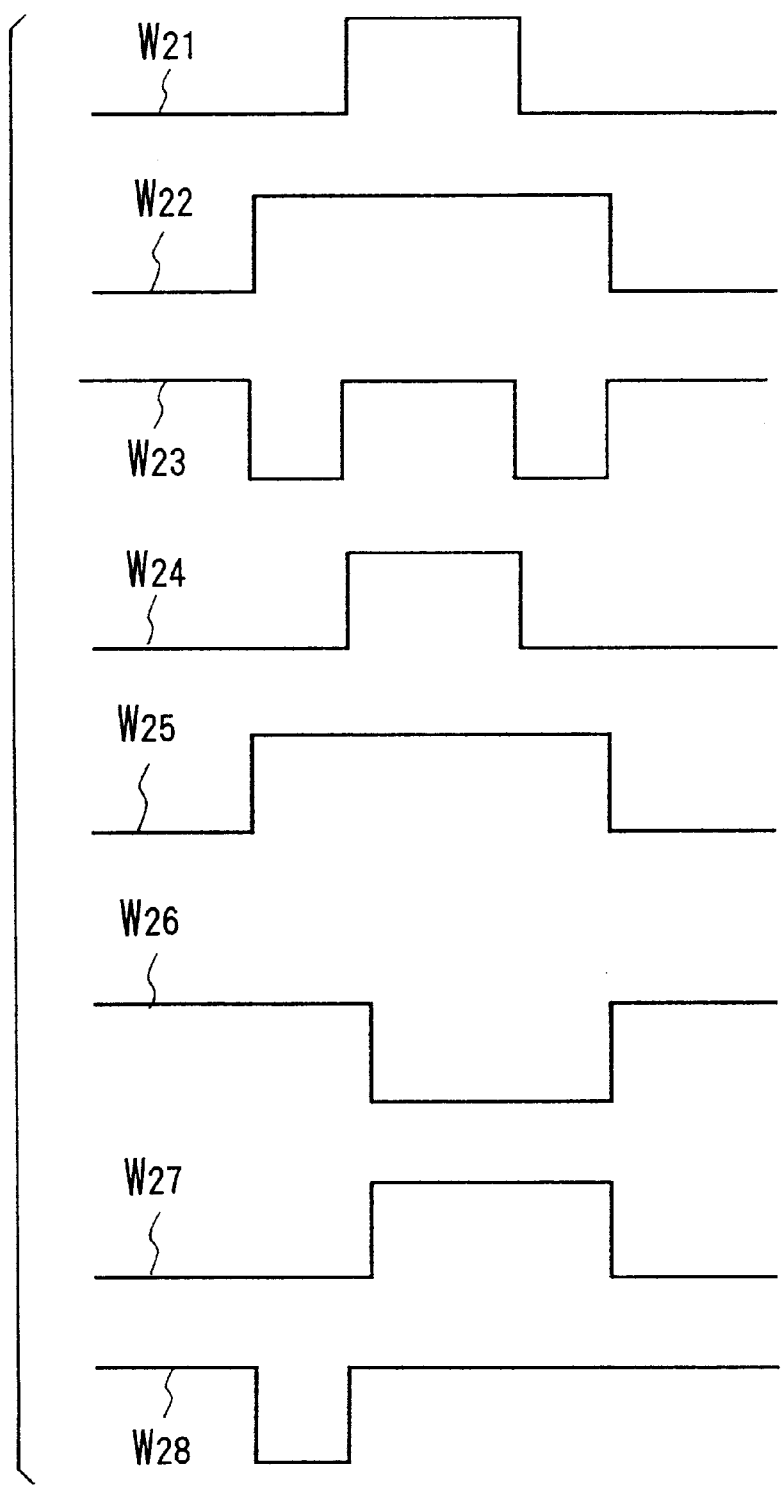
FIG. 3 is a diagram which illustrates the signal waveforms of each of the portions of the IC testing apparatus for the case where the pulse width of the comparison signal is wider than the pulse width of the standard signal.

FIG. 3 is a diagram which illustrates the signal waveforms of each of the portions of the IC testing apparatus for the case where the pulse width of the comparison signal is wider than the pulse width of the standard signal. Taking the case where the pulse width of the standard signal is wider than the pulse width of the comparison signal as an example, the operation up to the obtaining of the phase difference detection signal will be explained below, with reference to FIG. 1 and FIG. 3. It should be noted that the horizontal axis of FIG. 3 corresponds to the flow of time.

In FIG. 1, when a test pattern is outputted from the signal oscillating source 10, and it passes through the programmable delay circuit 20, the test pattern is then outputted to the output buffer and inputted into the signal selection circuit 30. Under the control of the CPU, the signal selection circuit 30 selects two signals from the signal lines 20a, and the standard signal and the comparison signal are outputted respectively to the signal line 30a and the signal line 30b.

The waveform of the outputted standard signal and the comparison signal are the waveforms with the reference numerals $W_{21}$, $W_{22}$, respectively, in FIG. 3. As can be seen from the diagram, the pulse width of the comparison signal is wider than the pulse width of the standard signal. These signals are inputted into the EXOR circuit 41 of the phase difference extraction circuit 40, and the exclusive-OR of the two signals is computed. The output of the EXOR circuit 41 is inputted into one of the input ends of both the AND circuit 42 and the NAND circuit 43. The comparison signal is inputted into the other input end of the NAND circuit 43, and an NAND operation is performed on this comparison signal with the output of the EXOR circuit 41. The output waveform of the NAND circuit 43 has the reference numeral $W_{23}$ in FIG. 3.

Also, the above mentioned standard signal and the comparison signal are inputted into both the AND circuit 51 and the OR circuit 52 of the mask circuit 50, and the AND the OR of the two signals are computed, respectively. The output of the AND circuit 51 and the OR circuit 52 have the reference numerals $W_{24}$, $W_{25}$ in FIG. 3 and are illustrated, respectively. The output of the AND circuit 51 is inputted into the clock end (CLK) of the Dff 54 via the delay circuit 53, and the output of the OR circuit 52 is connected to the reverse set input end S of the Dff 54. In FIG. 3, if the signals with the reference numerals $W_{24}$, $W_{25}$ are outputted from the AND circuit 51 and OR circuit 52, then a signal with the reference numeral $W_{26}$ is outputted from the Q output end of the Dff 54. Also, a signal with the reference numeral $W_{27}$ in FIG. 3 is outputted from the $\overline{Q}$ output end of the Dff 54.

The output signal of the above mentioned NAND circuit 43 and the output signal of the $\overline{Q}$ output end of the Dff 54 are inputted into the OR circuit 61 of the phase difference detection circuit 60, and an OR operation is performed on the two circuits. That is to say, when the standard signal and the comparison signal are signals with the reference numerals $W_{21}$, $W_{22}$, respectively, in FIG. 3, two inverted pulses are outputted from the NAND circuit 43, as illustrated in the waveform with the reference numeral $W_{23}$ in FIG. 3. However, only the left hand signal is necessary for performing a phase difference detection, as mentioned above. Then, the right hand signal of the signal with the reference numeral $W_{23}$ in FIG. 3 is masked by the OR circuit 61, using the signal outputted from the $\overline{Q}$ output end of the Dff 54. The output of the OR circuit 61 is illustrated by the signal with the reference numeral $W_{28}$ in FIG. 3. This signal is used in detecting a phase difference within the phase difference detection circuit 60.

The above was an explanation of the operation up to the detecting of the phase difference between the standard signal and the comparison signal outputted from the signal selection circuit 30. Next, the operation of eliminating the phase difference between the standard signal and the comparison signal will be explained, using the detected phase difference.

FIG. 4 is a diagram which illustrates the signal waveforms of each of the portions of the IC testing apparatus according to a preferred embodiment of the present invention. The waveform with the reference numeral $W_{31}$ in FIG. 4 is the waveform of the standard signal, and the waveform with the reference numeral $W_{32}$ in FIG. 4 is the waveform of the comparison signal. As shown in this diagram, an example of the case where the phase of the comparison signal progresses ahead of the phase of the standard signal will be explained.

In FIG. 4, the standard signal and the comparison signal with the reference numerals $W_{31}$, $W_{32}$, respectively, are inputted into the phase difference extraction circuit 40 and the mask circuit 50. Because the phase of the comparison signal progresses ahead of the phase of the standard signal, the output of the AND circuit 71 becomes a voltage of lowlevel. Consequently, a fail signal is not outputted from the Dff 72. This fail signal is inputted into the AND circuit 80 via the fail judgment circuit 110, and if the reverse reset signal is at a voltage of highlevel, then the AND circuit 80 is in an open state.

As mentioned above, the OR circuit 61 of the phase difference detection circuit 60 outputs a signal which indicates the phase difference between the standard signal and the comparison signal. This output signal is, then, inputted into the reverse reset input end R of the Dff 63. When the signal outputted from the OR circuit 61 is a voltage of lowlevel, the Dff 63 is reset. The waveform with the reference numeral $W_{33}$ in FIG. 4 illustrates the output signal waveform of the OR circuit 61. That is to say, while the signal outputted from the OR circuit 61 with the reference numeral $W_{33}$ in FIG. 4 is at a voltage of lowlevel, the Dff 63 is reset.

Also, the standard signal which is reversed by the NOT circuit 62 is inputted into the clock end (CLK) of the Dff 63. The waveform with the reference numeral $W_{34}$ in FIG. 4 illustrates the output signal waveform of the NOT circuit 62. The Dff 63 outputs an output signal from the Q output end which is synchronized with the reversed standard signal inputted into the clock end (CLK). The waveform with the reference numeral $W_{35}$ in FIG. 4 is the waveform of the signal outputted from the Q output end of the Dff 63.

Also, the signal with the reference numeral $W_{34}$ in FIG. 4 is inputted into the clock end (CLK) of the Dff 66 after passing through both the delay circuit 64 and the NOT circuit 65. The Dff 66 outputs from the Q output end, the signal outputted from the Q output end of the Dff 63, and outputs from the $\overline{Q}$ output end, the reverse of the signal outputted from the Q output end. The outputs of the Dff 66 are synchronized with the signal inputted into the clock end (CLK) of the Dff 66. The waveform with the reference numeral $W_{36}$ in FIG. 4 illustrates the waveform of the signal outputted from the Q output end of the Dff 66. As indicated by this waveform, a signal of lowlevel is outputted from the Q output end of the Dff 66 when there exists a phase difference between the standard signal and the comparison signal.

Conversely, a signal of highlevel is outputted from the $\overline{Q}$ output end of the Dff 66 when there exists a phase difference between the standard signal and the comparison signal. The signal outputted from the $\overline{Q}$ output end of the Dff 66 is inputted into the AND circuit 80. That is to say, a reverse reset signal is not outputted from the CPU, and the counter circuit 90 is not reset when the comparison signal progresses ahead of the standard signal; thus, the count proceeds according to the reversed standard signal which is inputted into the clock end (CLK), and the count value is outputted from the Q output end of the counter circuit 90.

The count value of the counter circuit 90 is outputted to the programmable delay circuit 20, and the amount of delay of the signal line in which the comparison is transmitted is increased according to the count value. In this manner, the comparison signal is gradually delayed. And when the phase difference is eliminated, as illustrated in FIG. 4, the signal which is outputted from the Q output end of the Dff 63 is fixed at a voltage of highlevel, and the signal outputted from the Q output end of the Dff 66 rises from a voltage of lowlevel to a voltage of highlevel at the moment the phases of the standard signal and the comparison signal match.

Conversely, the signal outputted from the $\overline{Q}$ output end of the Dff 66 drops from a voltage of highlevel to a voltage of lowlevel at the moment the phases of the standard signal and the comparison signal match, and then the AND circuit 80 is in a closed state, thereby resetting the counter circuit 90. As a result, changes to the amount of delay of the programmable delay circuit 20 are no longer made, and the signals which correspond to the standard signal and the comparison signal selected by the signal selection circuit 30 are outputted to the output buffer with matching phases. In the same manner, under the control of the CPU, the signal selection circuit 30 selects signal lines different from the currently selected signal lines, and by repetition of the above described operation, a test pattern may be outputted with matching phases.

The fail signal outputted from the fail judgment circuit 110, the output signal of the Q output end of the counter circuit 90, and the signal outputted from the Q output end of the Dff 66 are all outputted to the data read-back circuit 120. After these three signals are latched, then they are outputted to the CPU. Based on these signals, the CPU obtains the phase shift of each of the test patterns which form the test pattern.

When the CPU receives a fail signal, it instructs the signal selection circuit 30 to select signal lines other than the ones currently selected from among the signal lines 20*a*, and thus the above describe operation is repeated.

What is claimed is:

1. An IC testing apparatus comprising:

a selecting means for selecting two signals, a standard signal and a comparison signal, from a plurality of test signals;

an extracting means for extracting a phase difference between said standard signal and said comparison signal;

a determining means for determining the amount of delay of said comparison signal based on the phase difference extracted by said extracting means;

a delaying means for delaying said comparison signal based on the amount of delay determined by said determining means;

a detecting means for detecting said phase difference, and for instructing said determining means to fix the amount of delay when said phase difference is eliminated; and a controlling means for instructing said selecting means to change the selected test signals when said detecting means detects the elimination of said phase difference between said standard signal and said comparison signal, and for matching the phases of each of said test signals.

2. An IC testing apparatus in accordance with claim 1 wherein the extracting means comprises:

a phase extracting portion which extracts the phase difference based on a logical operation performed on said standard signal with said-comparison signal; and a mask generating portion which generates a mask for eliminating the portions of the phase difference extracted by said phase extracting portion which are unnecessary, based on a logical operation performed on said standard signal with said comparison signal.

3. An IC testing apparatus in according with claim 1 further comprising a fail detecting means for detecting the progress of the phase of said comparison signal with respect to the phase of said standard signal, then for outputting a fail signal to said controlling means.

4. An IC testing apparatus in according with claim 3 wherein said amount of delay determined by said determining means, said fail signal outputted by said fail detecting means, and the detected signal outputted from said detecting means are inputted into said controlling means, and bassed on said signals, said controlling means obtains the phase shift of said plurality of test signals.

* * * * *